United States Patent [19]

Duncan

[11] Patent Number: 4,979,615
[45] Date of Patent: Dec. 25, 1990

[54] INTEGRATED CIRCUIT DEVICE CONTAINER HAVING UNITARY CLOSING MEANS

[75] Inventor: William V. Duncan, Scottsdale, Ariz.

[73] Assignee: Motorola, Inc., Schaumburg, Ill.

[21] Appl. No.: 449,367

[22] Filed: Dec. 6, 1989

Related U.S. Application Data

[63] Continuation of Ser. No. 328,979, Mar. 27, 1989, abandoned.

[30] Foreign Application Priority Data

Apr. 6, 1988 [GB] United Kingdom ................. 8808027

[51] Int. Cl.⁵ ......................... B65D 73/02; A47F 1/04
[52] U.S. Cl. .................................... 206/328; 206/526;
221/251; 221/306; 229/93; 361/220
[58] Field of Search ................ 206/1.5, 328, 331, 334,
206/445, 499, 526, 332, 340; 221/306, 307, 310,
152, 251; 229/93; 361/212, 220

[56] References Cited

U.S. PATENT DOCUMENTS

| | | | |
|---|---|---|---|
| 687,613 | 11/1901 | Davis | 229/93 |
| 1,827,315 | 10/1931 | Hallen | 206/340 |
| 4,037,267 | 7/1977 | Kisor | 361/220 |
| 4,353,481 | 10/1982 | Tando | 221/307 X |
| 4,485,531 | 12/1984 | Murphy | 361/220 X |
| 4,533,043 | 8/1985 | Swain | 206/328 |
| 4,553,190 | 11/1985 | Mueller | 361/212 |
| 4,592,481 | 6/1986 | Chen | 206/328 X |
| 4,598,820 | 7/1986 | Murphy | 206/328 |
| 4,635,794 | 1/1987 | Lemmer | 206/328 |
| 4,685,562 | 8/1987 | Swain | 206/328 |
| 4,702,371 | 10/1987 | Hoshi et al. | 206/328 |
| 4,706,812 | 11/1987 | Spinelli et al. | 206/332 |

FOREIGN PATENT DOCUMENTS 1485609  5/1967  France .................................. 229/93

Primary Examiner—Bryon P. Gehman
Attorney, Agent, or Firm—Joe E. Barbee

[57] ABSTRACT

A container for holding and transporting integrated circuit devices has an integral closing element. The integral closing element is cut out from one of the walls of the container and, in its rest position, remains substantially within the cutout. In an engaged position the integral closing element is pushed into a cavity of the container to block passage of the integrated circuit devices. In the engaged position the integral closing element can either be engaged in an opening made in an opposite side of the container or else can be lodged against a shoulder formed as part of the cavity.

17 Claims, 2 Drawing Sheets

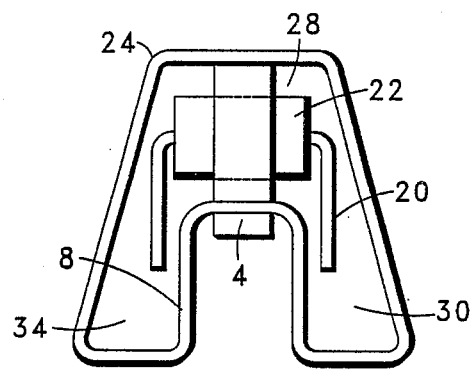
FIG.4
FIG.5
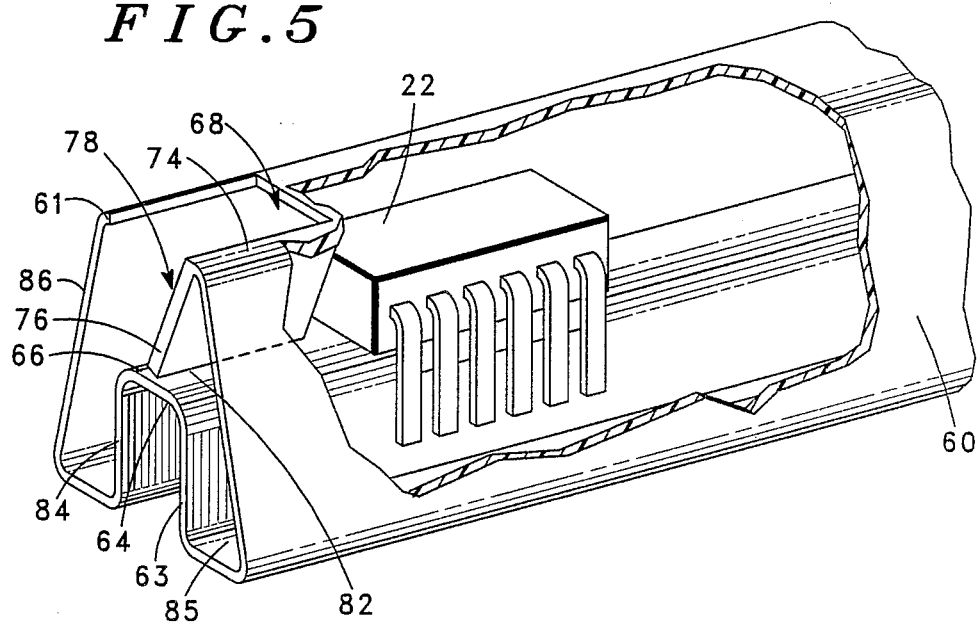

INTEGRATED CIRCUIT DEVICE CONTAINER HAVING UNITARY CLOSING MEANS

This application is a continuation of prior application Ser. No. 07/328,979, filed Mar. 27, 1989, now abandoned.

This invention relates to containers for articles and in particular to the closing of such containers. The invention relates particularly, though not exclusively, to containers for articles such as integrated circuit devices.

Integrated circuit devices, typically in dual in-line package (DIP) form, are conventionally protected during transport and handling by being carried in containers known as sleeves or rails. Typically, such a rail comprises an extrusion of anti-static plastics material having an open-ended hollow interior of a cross-section designed to match the cross-section of the DIP devices so that the DIP devices may be slid into the interior of the rail and carried therein in end-to-end relationship. The rails are also designed to be loaded into automatic insertion machines.

In order to prevent the DIP devices from sliding out of an end of the rail, it is known to stop the end with a plug or with a pin which passes through holes provided in top and bottom walls of the rail; in either instance the plug or pin is typically an interference fit.

A soft plastic plug is usually preferred because it is easier to remove and the softness provides a small measure of cushioning for the devices. Also if a tight fitting pin is used, it is possible that it will cause an internal burr on the end of the tube which can cause problems with the release of the devices. However, it is difficult to reliably remove such pins or plugs automatically by machine and therefore, most such pins or plugs are normally removed by a hand-held claw-type puller, by pliers or by an operator's fingers. Correspondingly thumb or hand pressure is normally used to insert the pins or plugs.

Whether their manipulation is by hand or by a puller, the use of pins or plugs involves time-consuming effort by an operator reducing the production capabilities of the production line. In addition pins can become lost or dropped into high tolerance machinery during handling and the loss of one or more pins from the end of the rail can cause inadvertent emptying of one DIP, or usually many more, from the rail. The resulting damage caused to the DIPs from a fall to a floor or table could easily render them useless. This problem is compounded when the process of release is automated as is usually the case, which requires the tubes to be inclined so that the DIPs are fed by gravity.

Alternatives to using pins etc. have been proposed. For example from U.S. Pat. No. 4533043 there is known a rail having an end-closing arrangement in the form of a spring finger extending into the hollow interior so as in a rest position to prevent inserted devices from sliding out of the rail. Devices may be inserted into the rail by sliding underneath the finger so as to deflect the finger sufficiently to allow the devices to enter the interior of the rail. Once a device has been inserted past the finger, the finger springs back to its rest position. With such an arrangement, however, the devices may be damaged by contact against the finger during insertion and also removal of the devices is compromised by the need to maintain the finger in a deflected position while allowing sufficient access for removal of the devices. Such known rails have not achieved significant commercial success.

It is the object of the present invention to provide a container for integrated circuit devices wherein the above disadvantages may be overcome or at least alleviated.

In accordance with the present invention there is provided a container for one or more integrated circuit devices. The container comprises a body having a longitudinal cavity therein for holding at least one device, an opening for inserting and removing the device from the cavity and closing means integral with the body for closing the opening to contain the device within the body. The closing means comprises: a member attached to a wall of the body so as to be resiliently extendable into the cavity, and a formation within the cavity, the member being resiliently movable between a first position in which it is substantially clear of the cavity to open the opening and a second position in which it extends across the cavity and engages the formation and resiliently locks therewith to close the opening.

Thus, it will be appreciated that since the member can be locked in a position so that it closes the opening, the devices can be confined securely in the rail using a very simple design, which also allows straightforward loading and unloading of the devices.

It will also be appreciated that since the locking of the member is resilient, the member may also act as a shock absorber preventing possible damage to devices during the handling and transit stages.

It will also be appreciated that due to the simple design of the invention the member can be produced during the rail manufacture as an in-line operation involving no elimination of pins and plugs, results in considerable potential for cost savings.

Three containers for integrated circuit devices in accordance with the present invention will now be described by way of example only, with reference to the accompanying drawings, in which:

FIG. 4 is an end view taken from the left side of the first rail shown in FIGS. 1 and 2; and FIG. 5 is a cut away perspective view of a third integrated circuit rail in accordance with the present invention.

Figure 1:
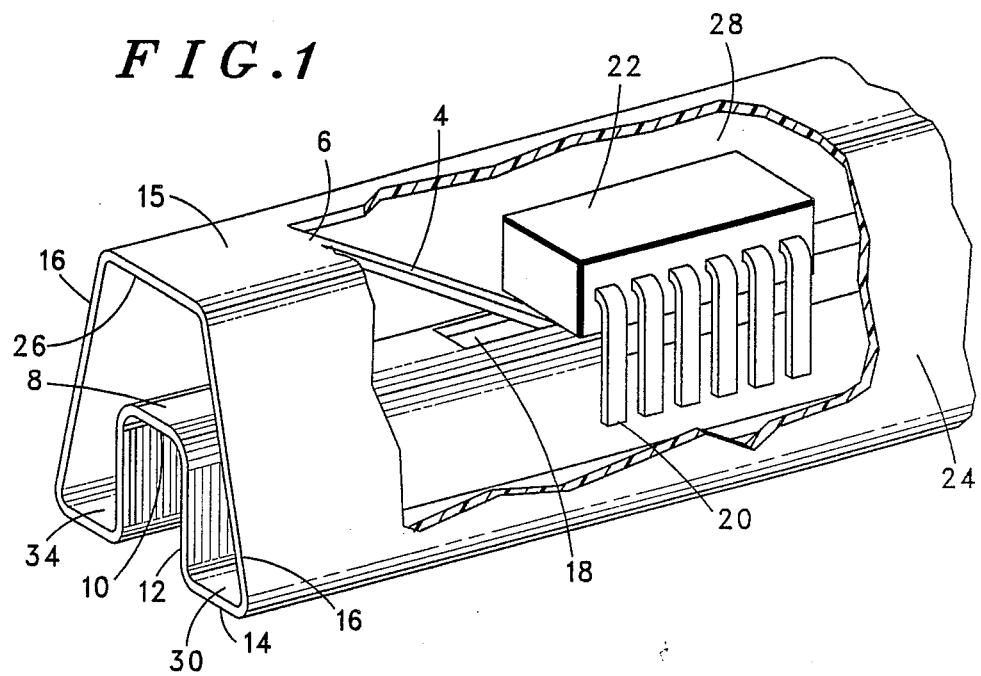
FIG. 1 is a cut-away perspective view of a first integrated circuit rail in accordance with the present invention.

FIG. 1 shows part of an extruded plastics anti-static rail for use in holding and transporting DIP semiconductor devices 22. The rail comprises a body 24 having a longitudinal cavity therein for holding at least one device 22 and has an open end 26. The body has a generally trapezoidal cross-section having upstanding tapered walls 16, extending from a base 14 and a generally planar horizontal wall 15 connecting the walls 16. Interior side walls 12 extend from the base to form a shoulder 8 having a connecting top surface 10. A channel 28 is defined between the top surface 10 of the shoulder and the top wall 15 of the rail. The DIP semiconductor devices are slidingly contained in the cavity, with their bodies located in the channel 28 and with their terminals 20 located in channels 30, 34 on respective sides of the shoulder 8, the bodies of the devices 22 resting on the shoulder 8. The number of semiconductor devices which can be held in end-to-end abutting relationship will depend on the rail's length. Various length rails may be employed.

A member 4 is formed integrally on one or preferably both ends of the rail by a cut through the top wall 15 extending along three sides of a rectangle such that the member extends generally along the length of the rail and is deflectable about an axis 6 perpendicular to the length of the rail.

A rectangular hole 18 is cut through the top surface 10 of the shoulder 8 near the end 26. The hole 18 is sized and positioned so as to cooperate with the member 4 in a manner which will be described fully below.

Figure 2:
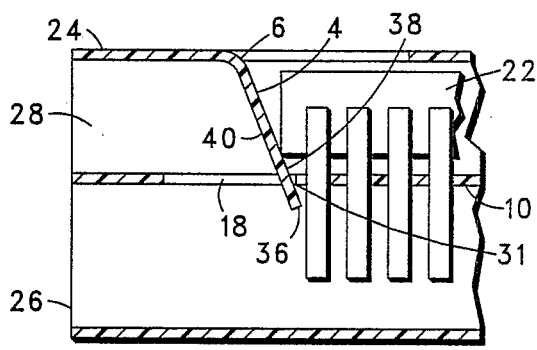
FIG. 2 is a cross-sectional side elevation of part of the first rail shown in FIG. 1.

Referring now also to FIG. 2, in use the member 4 rests in a first position substantially contiguous with the top wall 15 and does not obstruct the channel 28. With the member 4 in this first position devices 22 may be slidably inserted into or removed from the cavity as desired.

When a desired number of devices having been inserted, the end 26 is closed in the following manner. Force is applied (either manually or by using a suitable tool) to the member 4 in a downward direction from the top surface 38 so as to deflect the member 4 downward about the axis 6, the plastics material from which the rail 24 is formed being sufficiently flexible to allow the member 4 to be conveniently resiliently deflected in this way. As the member deflects it assumes a curvature having a center of curvature below the member. With continued application of the force the end 36 of the member 4 contacts the top wall 10 of the shoulder 8 slightly inwardly of the innermost edge 31 of the hole 18. Further application of the force causes the member 4 to change its curvature so that its center of curvature moves above the member. Further application of the force causes this changed sense of curvature to increase, the end 36 of the member moving towards the edge 31 of the hole 18 until the end reaches the edge. At this point the end 36 loses contact with the top wall 10 of the shoulder 8 and rapidly descends through the hole, the curvature of the member 4 reverting to its initial sense. The deflecting force is then removed and the member 4 moves slightly upwards until it engages the edge 31 of the hole 18 from below. The member 4 remains resiliently locked in this second position (as shown in FIG. 2), the flexibility of the plastics material being insufficient to allow the stress within the member to disengage the member from the hole.

Referring to FIG. 4, the cross-sectional configuration of the rail 24 shows more clearly the DIP semiconductor devices securely contained within the rail 24 by way of the member 4 resiliently locked in a second position, with their bodies located in the channel 28 and with their terminals 20 located in Channels 30, 34 on respective sides of the shoulder 8.

In order to unload the devices from the rail, the end 26 is opened in the following manner.

Locked in its second position through the hole 18, the member 4 is in contact with the innermost hole edge 31 slightly inwardly of the end 36 of the member, so that when a force is applied (either manually or by using a suitable tool) in an upward direction, to the bottom surface 40 of the member 4, the member 4 assumes a curvature having a center of curvature below the member. Further application of the force causes the curvature of the member 4 to increase, the end 36 of the member moving upwards towards the edge 31 of the hole 18 until the end reaches the edge. At this point the end 36 loses contact with the edge 31 and the resilience of the member 4 causes the member rapidly to return to its first position contiguous with the top wall 15, no further force being necessary.

In this open position the channel 28 is once again unobstructed and remains so without the application of any force to the member 4, and devices 22 may be inserted and removed as desired.

It will be appreciated that in its second positon the member 4 will provide a measure of cushioning for the semiconductor devices, by way of the hole 18 acting as a shock absorber, should the devices move about the rail during the transportation and handling stages. The devices are therefore held securely in end-to-end abutting relationship within the rail.

Figure 3:
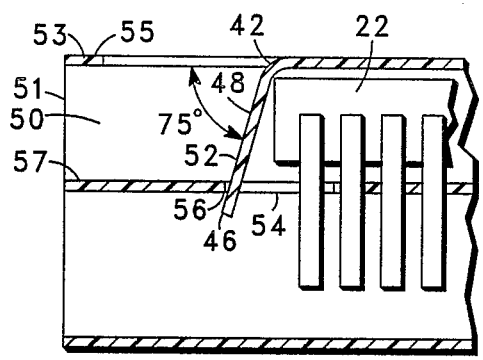
FIG. 3 is a cross-sectional side elevation of part of a second integrated circuit rail in accordance with the present invention.

Referring now to FIG. 3, a second integrated circuit rail 53 incorporating the invention is similar to the first rail described with reference to FIGS. 1 and 2. However the axis 42, about which the member 48 is deflectable, is more remote from the end 51 than the end 46 of the member 48. The manner in which the end 51 is opened and closed, that is the way in which the member 48 engages the hole 54, is identical to that described above for the end 26.

It has been found in practice that in both of the above described first and second embodiments (since their methods of operation are identical), devices are locked securely and efficiently in position when the members 4 and 48 respectively are locked in their second position such that their top surfaces 38 and 52 make an angle of 75° from the top surfaces 15 and 55 of the rails 24 and 53 respectively.

Referring now to FIG. 5, in a third embodiment of the present invention, an integrated circuit rail 60 has an end 61, which can be closed by way of a member 78 so that the DIP semiconductor devices 22 are contained resting on a shoulder 66 within. The member 78 is formed integrally on at least one end of the rail by a cut through the top wall 68 extending along two sides of a rectangle, a third side being formed by the end edge 76 of the wall 68 such that the member extends generally across the width of the rail and is deflectable about an axis 74 forming the fourth side of the rectangle and lying parallel to the length of the rail.

It will be appreciated that the member 78 may also be formed inwardly from the end of the rail, whereby the third side of the member, instead of being formed by the end edge 76 of the wall 68, is formed by making a cut through the top wall 68 so that the cut extends along three sides of a rectangle, with an axis forming the fourth side of the rectangle as in the above described third embodiment. This arrangement provides a portion of the top wall 68 lying between the third side of the member 78 and the end edge 76 of the top wall.

The methods by which the end 61 is opened and closed are similar to those described above for the rails shown in FIGS. 2 and 3 and therefore they will only be described briefly.

The member 78 rests in a first position substantially contiguous with the top wall 68. The end 61 is closed by applying a force to the member 78 in a downward direction so that the member 78 is deflected downward about the axis 74. With continued application of the force the end 82 of the member 78 contacts the top wall 64 of the shoulder 66 slightly inwardly of one of the edges 63 of the shoulder. Further application of the force causes the member's end 82 to move towards the edge 63 of the shoulder 66 until the end reaches the edge. At this point the end 82 loses contact with the shoulder 66 and is rapidly deflected into channel 85 which is formed on one side of the shoulder 66. The deflecting force is then removed and the member 78 moves upwards until its end 82 engages the interior side wall 84 which forms the shoulder 66, slightly below the top wall 64 of the shoulder. The member 78 remains resiliently locked in this second position within the channel 85.

To open the end 61, force is applied in an upward direction to the member 78 so that its end 82 moves upwards towards the edge 63 of the shoulder 66 until it reaches the edge. At this point the end 82 loses contact with the edge 63 and the member 78 rapidly returns to its first position contiguous with the top wall 68, no further force being necessary. The devices 22 can then be inserted or unloaded unobstructedly.

I claim:

1. A container for one or more integrated circuit devices comprising:
   an extruded body having a longitudinal cavity therein for holding at least one of said devices, said body further having a longitudinal shoulder within said cavity on which a preferred side of said one device may rest;
   an opening for inserting and removing said one device from said cavity; and
   closing means for closing said opening to contain said one device within said body, said closing means being unitary with said body;
   wherein said closing means comprises:
   a member attached to a wall of said body so as to be resiliently extendable into said cavity; and
   a formation within said cavity,
   said member being resiliently deflectable between a first disengaged position and a second engaged position,
   said member in said first disengaged position being at rest substantially clear of said cavity to open said opening, and
   said member in said second engaged position extending across said cavity and engaging said formation and resiliently locking therewith to block said opening, wherein said formation comprises a hole in said shoulder.

2. A container according to claim 1 wherein in said second engaged position said member locates within said hole and engages against an edge of said hole.

3. A container according to claim 2 wherein in said second engaged position said member extends downwardly and inwardly within said cavity.

4. A container according to claim 2 wherein in said second engaged position said member extends downwardly and outwardly within said cavity.

5. A container according to claim 1 wherein an opening is provided at each end of said body.

6. A container according to claim 1 wherein said body comprises a generally trapezoidal cross-section.

7. A container according to claim 1 wherein said body is formed of semi-rigid material.

8. A container according to claim 1 wherein said body is formed of plastics material.

9. A container according to claim 1 wherein said body has a coating of anti-static material.

10. A container for one or more integrated circuit devices comprising:
    an extruded body having a longitudinal cavity therein for holding at least one of said devices;
    an opening for inserting and removing said one device from said cavity; and
    closing means for closing said opening to contain said one device within said body, said closing means being unitary with said body;
    wherein said closing means comprises:
    a member attached to a wall of said body so as to be resiliently extendable into said cavity; and
    a formation within said cavity comprising a hole,
    said member being resiliently deflectable between a first disengaged position and a second engaged position,
    said member in said first disengaged position being at rest substantially clear of said cavity to open said opening, and
    said member in said second engaged position extending across said cavity and engaging said formation whereby said member locates within said hole and engages against an edge of said hole resiliently locking therewith to block said opening.

11. A container according to claim 10 wherein in said second engaged position said member extends downwardly and inwardly within said cavity.

12. A container according to claim 10 wherein in said second engaged position said member extends downwardly and outwardly within said cavity.

13. A container according to claim 10 wherein an opening is provided at each end of said body.

14. A container according to claim 10 wherein said body comprises a generally trapezoidal cross-section.

15. A container according to claim 10 wherein said body is formed of semi-rigid material.

16. A container according to claim 10 wherein said body is formed of plastics material.

17. A container according to claim 10 wherein said body has a coating of anti-static material.

* * * * *